US010914770B2

(12) United States Patent
Staver

(10) Patent No.: US 10,914,770 B2
(45) Date of Patent: Feb. 9, 2021

(54) ELECTRICAL ENERGY LOSS DETECTION

(71) Applicant: Microchip Technology Incorporated, Chandler, AZ (US)

(72) Inventor: Daniel A. Staver, Colorado Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 90 days.

(21) Appl. No.: 16/245,110

(22) Filed: Jan. 10, 2019

(65) Prior Publication Data

US 2020/0132739 A1 Apr. 30, 2020

Related U.S. Application Data

(60) Provisional application No. 62/750,604, filed on Oct. 25, 2018.

(51) Int. Cl.
*G01R 22/06* (2006.01)
*G01R 11/57* (2006.01)

(52) U.S. Cl.
CPC ............ *G01R 22/066* (2013.01); *G01R 11/57* (2013.01)

(58) Field of Classification Search
CPC ...... G01R 11/24; G01R 11/25; G01R 22/066; G01R 22/068
See application file for complete search history.

(56) References Cited

U.S. PATENT DOCUMENTS

| 2010/0134089 | A1 | 6/2010 | Uram et al. | |
|---|---|---|---|---|
| 2012/0041696 | A1* | 2/2012 | Sanderford, Jr. | ...... G06Q 50/06 702/62 |
| 2014/0035760 | A1 | 2/2014 | Yang | |
| 2014/0358839 | A1* | 12/2014 | Dhurandhar | ........... G06Q 50/06 706/48 |
| 2016/0131686 | A1* | 5/2016 | Handley | ............... G01D 4/004 324/76.11 |

FOREIGN PATENT DOCUMENTS

CN 108562773 A 9/2018

OTHER PUBLICATIONS

International Search Report for International Application No. PCT/US2019/056106, dated Jan. 8, 2020, 4 pages.
International Written Opinion for International Application No. PCT/US2019/056106, dated Jan. 8, 2020, 7 pages.

* cited by examiner

*Primary Examiner* — Tung X Nguyen
(74) *Attorney, Agent, or Firm* — TraskBritt

(57) ABSTRACT

Various embodiments relate to detecting theft of electrical energy. A method of detecting theft of electrical energy may include measuring, for each time sample of a number of time samples, a neutral current of an electrical energy metering system. The method may further include summing, for each time sample of the number of time samples, a number of measured phase current values of the electrical energy metering system to determine an imputed neutral current. Further, the method may include determining, for each time sample of the number of time samples, a squared difference between the measured neutral current and the imputed neutral current. Moreover, the method may include integrating, for each time sample of the number of time samples, the squared difference to determine an accumulator value. In addition, the method may include detecting, based on the accumulator value, theft of electrical energy from the electrical energy metering system.

22 Claims, 5 Drawing Sheets

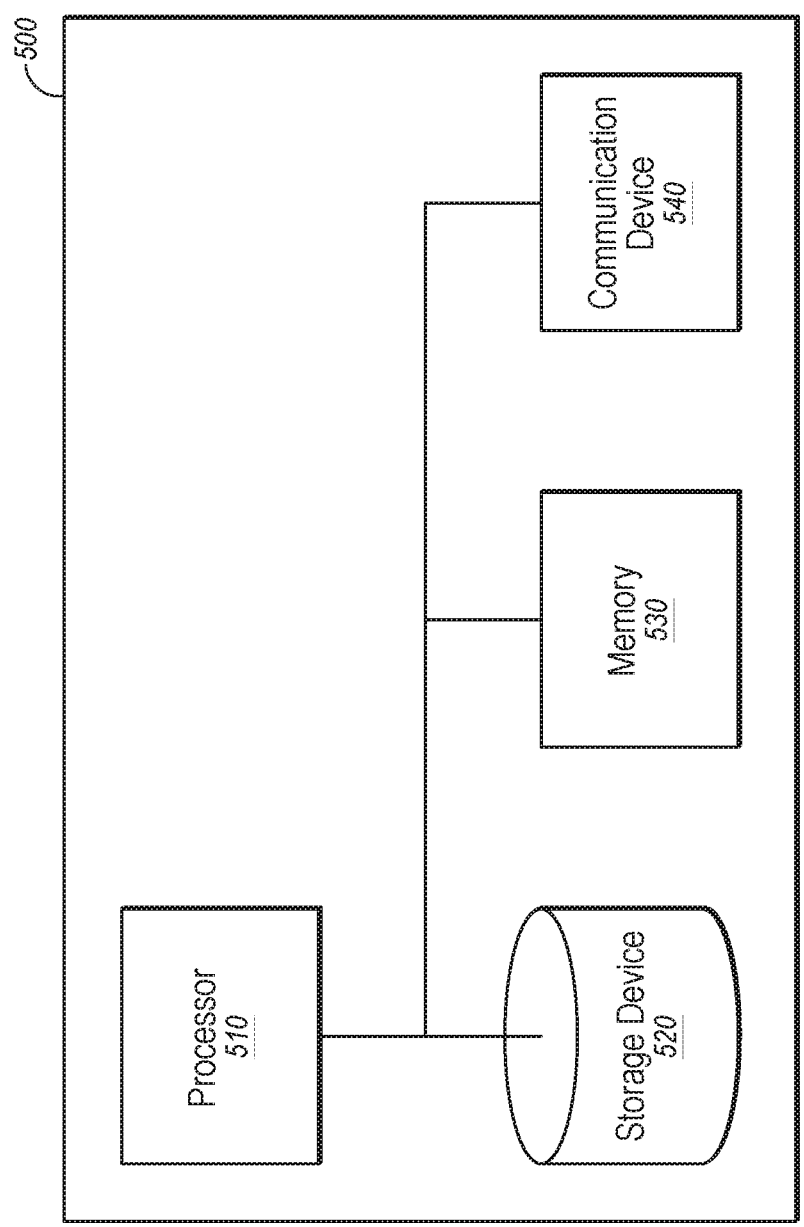

ELECTRICAL ENERGY LOSS DETECTION

CROSS-REFERENCE TO RELATED APPLICATION

A claim for benefit of priority to the Oct. 25, 2018 filing date of the U.S. Patent Provisional Application No. 62/750,604 titled "ELECTRICAL ENERGY LOSS DETECTION" (the '604 Provisional Application), is hereby made pursuant to 35 U.S.C. § 119(e). The entire disclosure of the '604 Provisional Application is hereby incorporated herein.

FIELD

The present disclosure relates generally to electrical energy loss detection, and more specifically, to detection of theft of electrical energy from an electrical energy metering system. Yet more specifically, various embodiments relate to detecting loss of electrical energy via detecting a phase and/or magnitude imbalance between a measured neutral current and an imputed neutral current of the electrical energy metering system.

BACKGROUND

Theft of electrical energy is a widespread problem costing utility providers billions of dollars annually. A number of approaches for detecting theft of electrical energy have been proposed, however, conventional approaches require significant processing resources and, in many cases, are unreliable.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 5 is a block diagram of an example computing system, according to one or more embodiments of the disclosure.

DETAILED DESCRIPTION

Figures 1A, 1B:
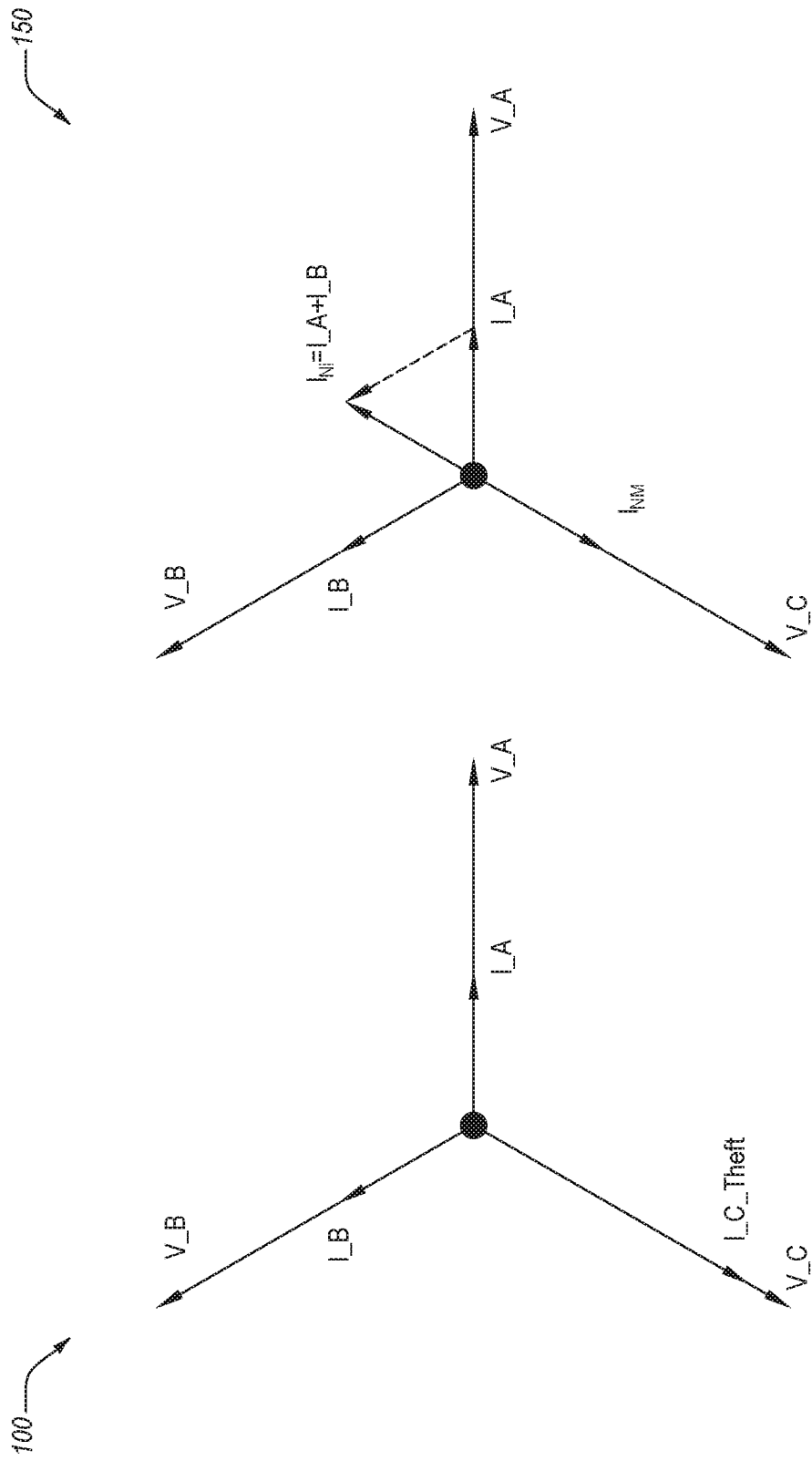
FIGS. 1A and 1B depict vector diagrams of various voltage and current vectors associated with an electrical energy metering system.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Theft of electrical energy from an electrical energy metering system may include bypassing an electrical meter, stealing energy from one or more voltage phases of the metering system, and returning current back into a neutral line of the metering system. This may result in a neutral current being perturbed from its theoretical condition (i.e., had no energy been stolen). A theoretical neutral current, which may be determined from phase currents (i.e., assuming no loss (e.g., due to theft)) may also be referred to herein as an "imputed neutral current." An imputed neutral current may include the sum of measured phase currents.

Various embodiments disclosed herein related to detecting loss of energy from an electrical energy metering system. For example, the loss of the energy may be due to theft of the energy. According to some embodiments, by determining a sample-by-sample square of a difference between measured neutral current sample data and imputed neutral current sample data, (e.g., (measured neutral current−imputed neutral current)^2) and integration thereof may be generated with minimal computation. According to some embodiments, the integration may allow for detection of an imbalance (in magnitude and/or phase) between the measured neutral current and the imputed neutral current (i.e., the ideal current if no theft were occurring). In these and other embodiments, it may not be necessary to compute actual phase angles of the measured and imputed neutral currents. Further, in some embodiments, a phase angle between the measured and imputed neutral currents may be determined via, for example, the Law of Cosines. A signal indicative of the determined phase angle may be outputted.

According to some embodiments, to detect loss (e.g., theft), a measured neutral current ($I_{NM}$) (e.g., an actual neutral current) may be compared against an imputed neutral current ($I_{Ni}$). Theft may be indicated when $|I_{Nm}| \neq |I_{Ni}|$. However, some theft detection schemes may produce conditions where $|I_{Nm}|=|I_{Ni}|$. In other words, theft of electrical energy may still be occurring if the magnitude of measured neutral current $I_{NM}$ is equal to the magnitude of imputed neutral current $I_{Ni}$. Accordingly, only measuring, computing, and comparing magnitude of neutral currents (e.g., actual vs. imputed) may not be sufficient to detect theft of electrical energy.

FIGS. 1A and 1B are vector diagrams illustrating various voltage and current vectors associated with an electrical energy metering system. Specifically, FIG. 1A depicts a vector diagram 100 illustrating phase voltage vectors V_A, V_B, and V_C, each separated by 120 degrees. Vector diagram 100 further depicts phase current vectors I_A and I_B. Another phase current vector I_C_theft. As shown in FIG. 1A, phase current vector I_C_theft has a greater magnitude than both phase current vectors I_A and I_B, which may indicate theft of electrical energy associated with the electrical energy metering system.

As illustrated in a vector diagram 150 of FIG. 1B, an imputed neutral current $I_{Ni}$ may be estimated by summing phase current vector I_A and phase current vector I_B. If the measured imputed neutral current $I_{Ni}$ is added to phase current vector I_C_Theft, a measured neutral current $I_{NM}$ is 180 degrees out of phase from the measured imputed neutral current $I_{Ni}$. However neutral current $I_{NM}$ and imputed neutral current $I_{Ni}$ may have or appear to have equal magnitudes. Accordingly, only measuring and comparing magnitudes of measured neutral current $I_{NM}$ and imputed neutral current $I_{Ni}$ may not be sufficient for detecting theft of electrical energy.

Determining current phase angles (e.g., for measured and imputed neutral currents) may require significant processing resources, and existing approaches for estimating current phase angles (e.g., using narrow band filtered (NBF) zero-crossings, cross-correlation computation, and raw zero-crossings) are problematic (e.g., due to frequency drift and noise, differential phase velocity of raw versus NBF signals, additional processing (e.g., digital signal processing) resources, and/or inaccuracy and/or misleading results).

Various embodiments, as disclosed herein, may relate to detecting loss (e.g., theft) of electrical energy without a need for neutral current phase measurements. More specifically, for example, a difference between a measured neutral current and an imputed neutral current, which may be determined without estimating phase angles, may be used to detect electrical energy loss (e.g., loss due to theft). For example, according to some embodiments, a squared integrated difference of a measured neutral current and an imputed neutral current may be used to detect loss of electrical energy.

For at least these reasons, various embodiments of the present disclosure, as described more fully herein, provide a technical solution to one or more problems that arise from technology that could not reasonably be performed by a person, and various embodiments disclosed herein are rooted in computer technology in order to overcome the problems and/or challenges described above. Further, at least some embodiments disclosed herein may improve computer-related technology by allowing computer performance of a function not previously performable by a computer.

Although various embodiments are described herein with reference to detection of theft of electrical energy, the disclosure is not so limited. Rather, various embodiments may be applicable for detecting loss, which may or may not be due to theft. For example, a magnet positioned (e.g., inadvertently) near a current sensor of one of the phases may cause a difference. Any loss due to the magnet may be detected via one or more embodiments disclosed herein. In at least some embodiments, the term "loss" may not include general transmission line loss, which may affect all conductors.

Figure 2:
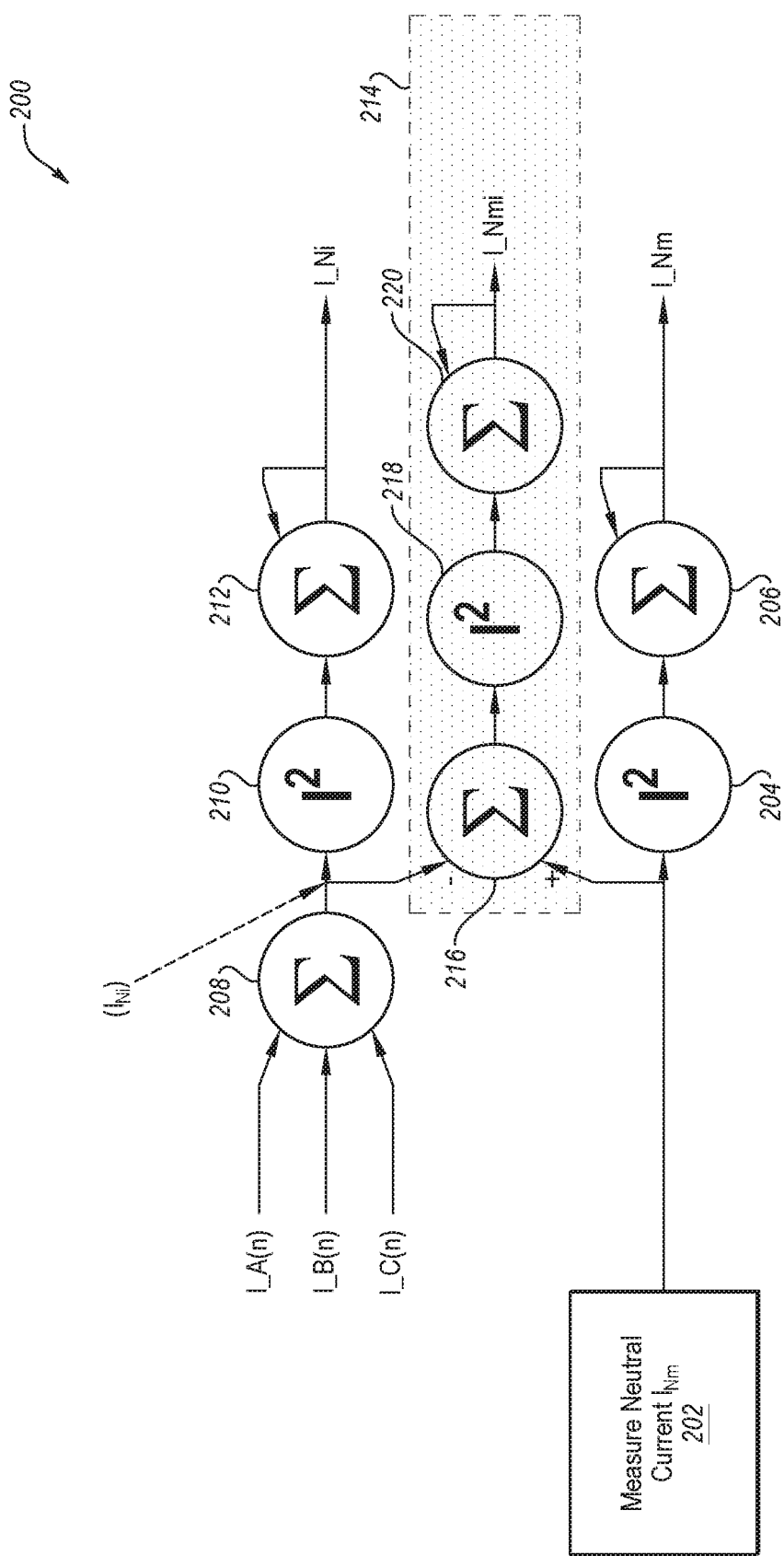
FIG. 2 is a diagram of an example flow that may be used for detecting loss of electrical energy, in accordance with one or more embodiments of the disclosure.

FIG. 2 is a diagram of an example flow 200 that may be used for detecting theft of electrical energy, arranged in accordance with at least one embodiment described herein. In these and other embodiments, at least a portion of flow 200 may be an example of an operation of system 500, as described below with reference to FIG. 5.

Flow 200 may begin at block 202. At block 202, a neutral current $I_{Nm}$ may be measured. More specifically, for each time sample of a number of time samples, a neutral current may be measured. For example, an instantaneous input full-bandwidth neutral current, for each time sample, may be measured. In some embodiments, measured neutral current $I_{Nm}$ may include raw data (i.e., data with minimal or no substantial signal processing). In other embodiments, measured neutral current $I_{Nm}$ may include filtered data.

At block 204, measured neutral current $I_{Nm}$ may be squared. More specifically, for example, at block 204, for each time sample, measured neutral current $I_{Nm}$ may be squared. Further, at block 206, the squared measured neutral current may be integrated (e.g., over an integral number of half cycles) to determine an integrated measured neutral current squared I_Nm.

At block 208, an imputed neutral current $I_{Ni}$ may be estimated. More specifically, for each time sample of the number of time samples, a number of measured current phase values (e.g., current phases I_A (n), I_B (n) and I_C (n)) may be summed to determine the imputed neutral current. The measured current phase value may include filtered data or raw data. For example, imputed neutral current for each time sample may be estimated according to the following equation:

$$I_{Ni}(n) = \sum_{i=...}^{all\ main\ current\ phases} I_i(n)$$

-continued $$I_{Ni}(n) = \sum_{i=...}^{all\ main\ current\ phases} I_i(n).$$

At block 210, the estimated imputed neutral current $I_{Ni}$ may be squared. More specifically, for example, at block 210, for each time sample, the estimated imputed neutral current $I_{Ni}$ may be squared. Further, at block 212, the squared imputed neutral current may be integrated (e.g., over an integral number of half cycles) to determine an integrated imputed neutral current squared I_Ni.

At block 214, an accumulation of squared samples of the difference between the measured and imputed neutral current samples, over an integral (e.g., an integral number of half cycles (INHC)), may be determined to generate an integrated difference of neutral currents squared I_Nmi (also referred to herein as an accumulator value). More specifically, for example, on a sample-by-sample basis, at block 216, the sum of the imputed neutral currents from block 208 may be subtracted from the measured neutral current from block 202. Further, at block 218, the difference between the imputed neutral currents and the measured neutral current may be squared. At block 220, the difference squared may be integrated (e.g., over an integral number of half cycles (INHC)) to determine accumulator value I_Nmi. For example, accumulator value I_Nmi may be determined according to the following equation:

$$I\_Nmi = \sum_{n=0}^{INHC}(I_{Nm}(n) - I_{Ni}(n))^2.$$

According to various embodiments of the disclosure, depending on accumulator value I_Nmi, theft of electrical energy may be detected. For example, if accumulator value I_Nmi is a non-zero value, theft of electrical energy may be occurring. Further, based on accumulator value I_Nmi, a utility company (i.e., providing energy) may take action. More specifically, if accumulator value I_Nmi is above a predetermined threshold value, the utility company may take one or more actions (e.g., to remedy the theft).

Accordingly, various embodiments of the disclosure may allow for detection of any appreciable perturbation from the theoretical imputed neutral current, $I_{Ni}$, whether in magnitude and/or phase, all without significant signal processing.

Further, according to some embodiments, if desired, a phase angle between measured and imputed neutral currents, $I_{Nm}$ and $I_{Ni}$, may be computed using the Law of Cosines according to the following equation:

$$\text{Angle}(I_{Nm-Ni}) = \arccos\left(\frac{(I\_Nmi)^2 - (I\_Nm)^2 - (I\_Ni)^2}{-2 \times I\_Nm \times I\_Ni}\right).$$

For example, in some embodiments, each current channel measurement may be scaled by its individual sensor scale factor (e.g., instead of assuming identical sensor scale factors).

Figure 3:
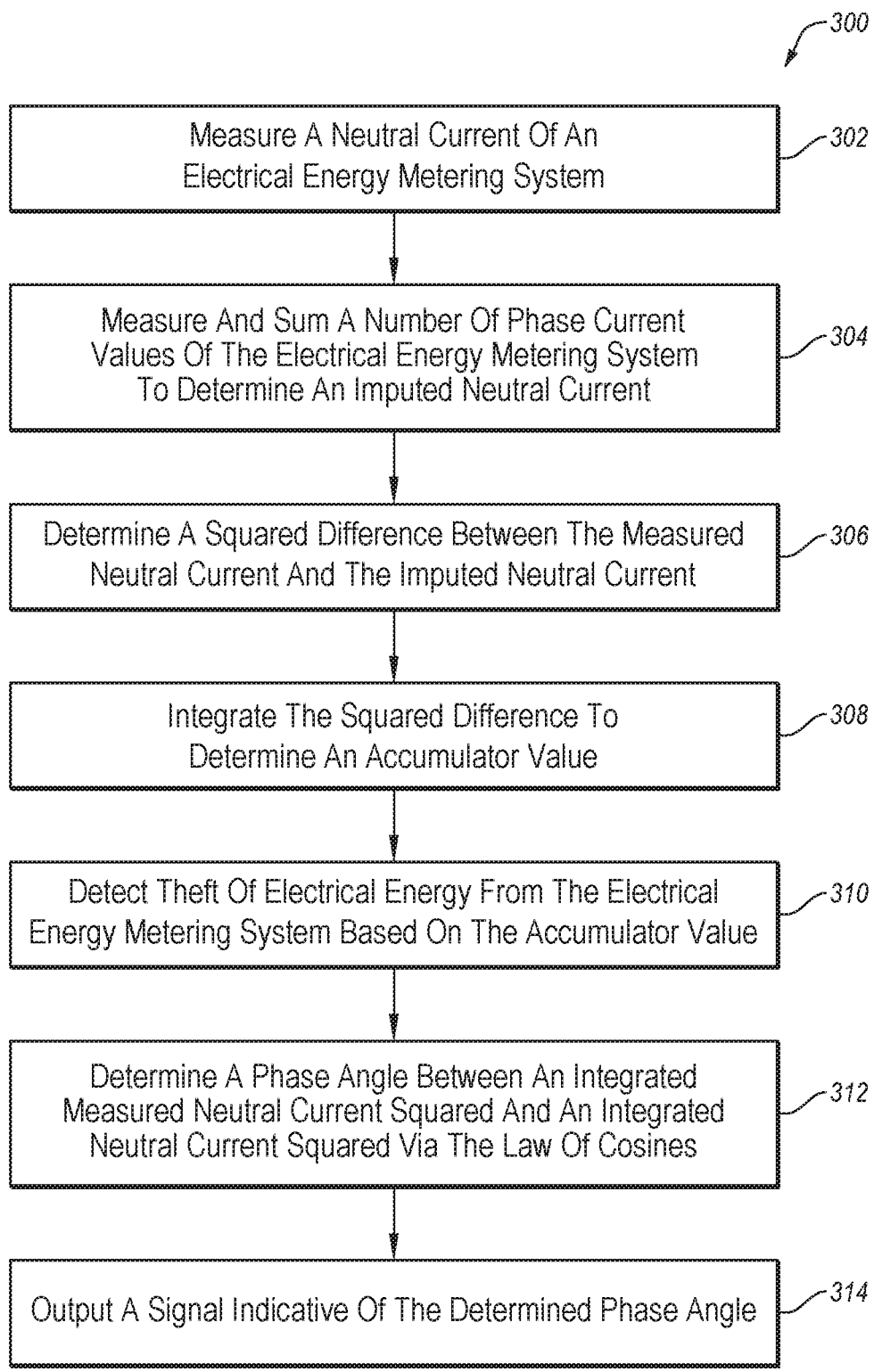
FIG. 3 illustrates an example flow diagram of a method of detecting loss of electrical energy, according to one or more embodiments of the disclosure.

FIG. 3 is a flowchart of an example method 300 of detecting theft of electrical energy. Method 300 may be arranged in accordance with at least one embodiment described in the present disclosure. Method 300 may be performed, in some embodiments, by a device or system, such as a system 500 (see FIG. 5), one or more of the components thereof, or another system or device. In these and other embodiments, method 300 may be performed based on the execution of instructions stored on one or more non-transitory computer-readable media. Although illustrated as discrete blocks, various blocks may be divided into additional blocks, combined into fewer blocks, or eliminated, depending on the desired implementation.

Method 300 may begin at block 302, where a neutral current of an electrical energy metering system may be measured, and method 300 may proceed to block 304. For example, for each time sample of a number of time samples, the neutral current may be measured. For example, the neutral current may be measured via a processor 510 (see FIG. 5).

At block 304, a number of phase currents of the electrical energy metering system may be measured and summed to determine an imputed neutral current, and method 300 may proceed to block 306. For example, for each time sample of the number of time samples, the number of phase currents measured may be summed to determine the imputed neutral current. For example, the number of phase currents may be summed via processor 510 (see FIG. 5).

At block 306, a square of the difference between the measured neutral current and the imputed neutral current may be determined, and method 300 may proceed to block 308. For example, for each time sample of the number of time samples, the squared difference between the measured neutral current and the imputed neutral current may be determined. In some embodiments, the squared difference between the measured neutral current and the imputed neutral current may be determined via processor 510 (see FIG. 5).

At block 308, the squared difference may be integrated to determine an accumulator value, and method 300 may proceed to block 310. For example, for each time sample of the number of time samples, the squared difference may be integrated to determine the accumulator value. In some examples, the squared difference may be integrated via processor 510 (see FIG. 5).

At block 310, theft of electrical energy from the electrical energy metering system may be detected based on the accumulator value. For example, if the determined accumulator value is a non-zero value, it may be determined that theft of electrical energy is occurring, and a signal may be output indicative of the determined theft of electrical energy. Optionally, the signal may include one or more of the determined non-zero value, the measured neutral current of block 302 and the measured phase currents of block 304.

Modifications, additions, or omissions may be made to method 300 without departing from the scope of the present disclosure. For example, the operations of method 300 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, at block 312, a phase angle between measured and imputed neutral currents, $I_{Nm}$ and $I_{Ni}$, may be additionally computed (e.g., using the Law of Cosines). Further, at block 314, a signal indicative of the determined phase angle may be outputted.

In addition to other benefits and advantages, as described herein, various embodiments of the disclosure may introduce very little added computational burden. More specifically, additional computation may be limited to computing summation of squared-differences between raw measured and raw imputed neutral current samples. Computation of current channel phase angles may not be required, nor is estimating current channel zero-crossings.

In various embodiments, to reduce computational burden associated with phase-correcting sensor data, raw data (i.e., implying no or minimal signal processing without phase-correction to reduce phase error variability between current sensors) may be used. Lack of phase correction may manifest as a slightly greater fraud detection threshold. However, in embodiments where sufficient CPU processing power is available, current sensor phase-equalization (e.g., to correct phase errors introduce by current sensors) may be employed in the computation of accumulator value I_Nmi.

Figure 4:
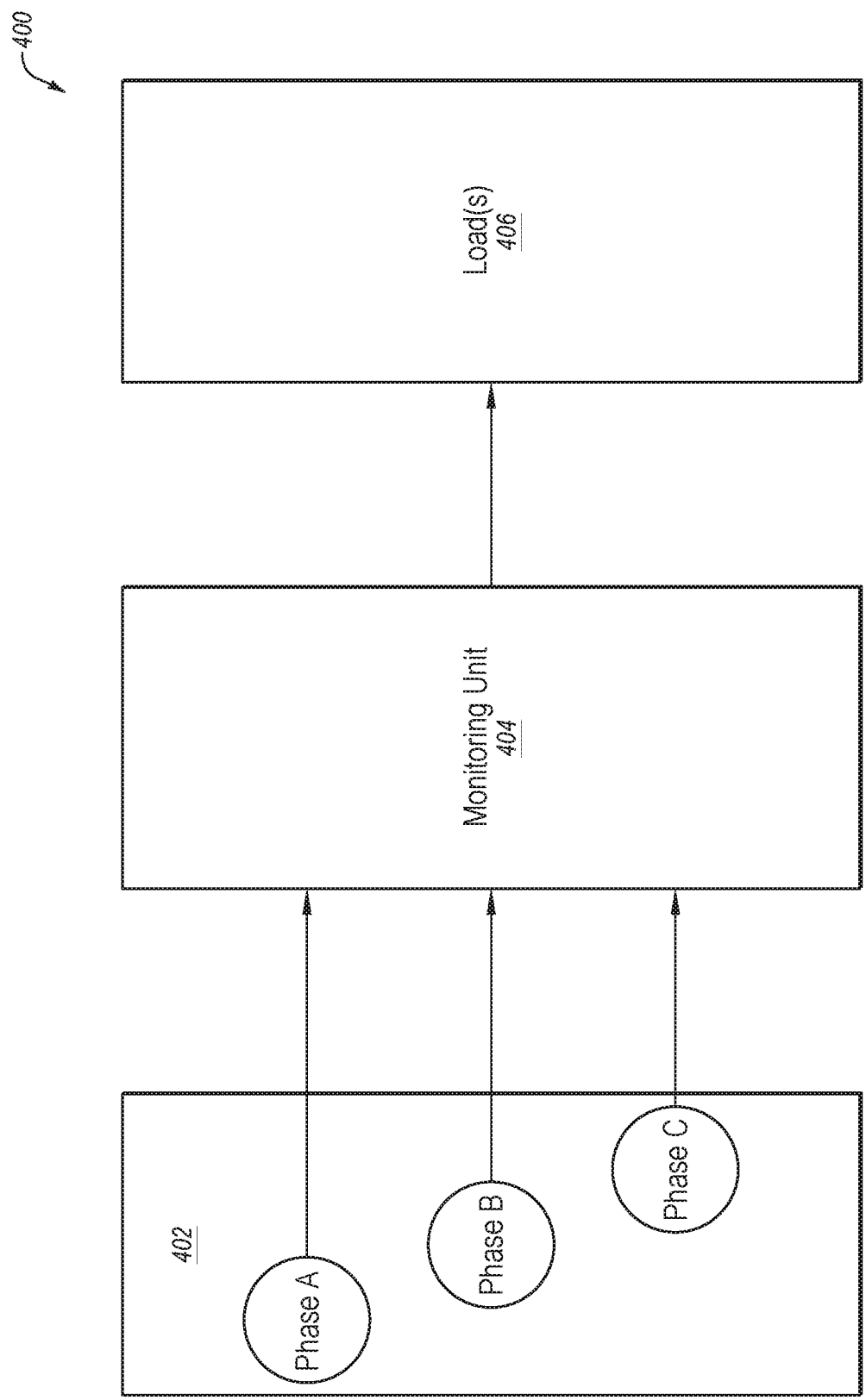
FIG. 4 is a block diagram depicting a system including a source, a monitoring system, and one or more loads, according to various embodiments of the disclosure.

FIG. 4 is a block diagram of a system 400 including a source 402, a monitoring unit 404, and one or more electrical loads 406, in accordance with various embodiments of the disclosure. In the embodiments illustrated in FIG. 4, source 402 includes a three-phase power distribution system including phase A, phase B, and phase C, each of which being offset from the other phases (e.g., by approximately 120 degrees). In other embodiments, source 402 may include a different power distribution system (e.g., a single phase power distribution system).

Monitoring system 400, which, in some embodiments may include one or more electrical meters, may be configured for performing one or more operations described herein to detect loss of electrical energy (e.g., due to theft). For example, monitoring unit 404 may include at least a portion of system 500 shown in FIG. 5 in communication with the one or more electrical meters.

FIG. 5 is a block diagram of an example computing system 500, in accordance with at least one embodiment of the present disclosure. Computing system 500 may be embodied in a desktop computer, a laptop computer, a server computer, a tablet computer, a mobile phone, a smartphone, a personal digital assistant (PDA), an e-reader device, a network switch, a network router, a network hub, other networking devices, or other suitable computing device.

Computing system 500 may include processor 510, a storage device 520, a memory 530, and a communication device 540. Processor 510, storage device 520, memory 530, and/or communication device 540 may all be communicatively coupled such that each of the components may communicate with the other components. Computing system 500 may perform any of the operations described in the present disclosure.

In general, processor 510 may include any suitable special-purpose or general-purpose computer, computing entity, or processing device including various computer hardware or software modules and may be configured to execute instructions stored on any applicable computer-readable storage media. For example, processor 510 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data. Although illustrated as a single processor in FIG. 5, processor 510 may include any number of processors configured to perform, individually or collectively, any number of operations described in the present disclosure.

In some embodiments, processor 510 may interpret and/or execute program instructions and/or process data stored in storage device 520, memory 530, or storage device 520 and memory 530. In some embodiments, processor 510 may fetch program instructions from storage device 520 and load the program instructions in memory 530. After the program instructions are loaded into memory 530, processor 510 may execute the program instructions.

For example, in some embodiments one or more of the processing operations of a device and/or system (e.g., an application program, a server, etc.) may be stored in storage device 520 as program instructions. Processor 510 may fetch the program instructions of one or more of the processing operations and may load the program instructions of the processing operations in memory 530. After the program instructions of the processing operations are loaded into memory 530, processor 510 may execute the program instructions such that computing system 500 may implement the operations associated with the processing operations as directed by the program instructions.

Storage device 520 and memory 530 may include computer-readable storage media for carrying or having computer-executable instructions or data structures stored thereon. Such computer-readable storage media may include any available media that may be accessed by a general-purpose or special-purpose computer, such as processor 510. By way of example, and not limitation, such computer-readable storage media may include tangible or non-transitory computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause processor 510 to perform a certain operation or group of operations.

In some embodiments, storage device 520 and/or memory 530 may store data associated with energy theft detection. For example, storage device 520 and/or memory 530 may store imputed and/or measured current values, and/or any other data related to energy theft detection.

Communication device 540 may include any device, system, component, or collection of components configured to allow or facilitate communication between computing system 500 and another electronic device. For example, communication device 540 may include, without limitation, a modem, a network card (wireless or wired), an infrared communication device, an optical communication device, a wireless communication device (such as an antenna), and/or chipset (such as a Bluetooth device, an 802.6 device (e.g. Metropolitan Area Network (MAN)), a Wi-Fi device, a WiMAX device, cellular communication facilities, etc.), and/or the like. Communication device 540 may permit data to be exchanged with any network such as a cellular network, a Wi-Fi network, a MAN, an optical network, etc., to name a few examples, and/or any other devices described in the present disclosure, including remote devices.

Modifications, additions, or omissions may be made to FIG. 5 without departing from the scope of the present disclosure. For example, computing system 500 may include more or fewer elements than those illustrated and described in the present disclosure. For example, computing system 500 may include an integrated display device such as a screen of a tablet or mobile phone or may include an external monitor, a projector, a television, or other suitable display device that may be separate from and communicatively coupled to computing system 500.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

We claim:

1. A method of detecting theft of electrical energy, the method comprising:
   measuring, for each time sample of a number of time samples, a neutral current of an electrical energy metering system;
   summing, for each time sample of the number of time samples, a number of measured phase current values of the electrical energy metering system to determine an imputed neutral current;
   determining, for each time sample of the number of time samples, a squared difference between the measured neutral current and the imputed neutral current;
   integrating, for each time sample of the number of time samples, the squared difference to determine an accumulator value; and
   detecting, based on the accumulator value, theft of electrical energy from the electrical energy metering system.

2. The method of claim 1, wherein the integrating comprises integrating, for each time sample of the number of time samples, the squared difference over an integral number of half cycles to determine the accumulator value.

3. The method of claim 1, further comprising:
   squaring, for each time sample of the number of time samples, the measured neutral current; and
   integrating, for each time sample of the number of time samples, the squared measured neutral current to determine an integrated measured neutral current squared.

4. The method of claim 3, further comprising:
   squaring, for each time sample of the number of time samples, the imputed neutral current; and
   integrating, for each time sample of the number of time samples, the squared imputed neutral current to determine an integrated imputed neutral current squared.

5. The method of claim 4, further comprising:
   determining a phase angle between the integrated measured neutral current squared and the integrated imputed neutral current squared via the Law of Cosines; and
   outputting a signal indicative of the determined phase angle.

6. The method of claim 1, wherein the measuring the neutral current of the electrical energy metering system comprises one of processing raw data and processing filtered data to measure the neutral current.

7. The method of claim 1, wherein the summing the number of measured phase currents to determine the imputed neutral current comprises one of summing raw data and summing filtered data.

8. A system, comprising:
   one or more processors configured to:
      measure, for each time sample of a number of time samples, a neutral current of an electrical energy metering system;
      sum, for each time sample of the number of time samples, a number of measured phase current values of the electrical energy metering system to determine an imputed neutral current;
      determine, for each time sample of the number of time samples, a squared difference between the measured neutral current and the imputed neutral current;
      integrate, for each time sample of the number of time samples, the squared difference to determine an accumulator value; and
      detect, based on the accumulator value, theft of electrical energy from the electrical energy metering system.

9. The system of claim 8, wherein the one or more processors are configured to integrate, for each time sample of the number of time samples, the squared difference over an integral number of half cycles to determine the accumulator value.

10. The system of claim 8, wherein the one or more processors are further configured to:
    square, for each time sample of the number of time samples, the measured neutral current; and
    integrate, for each time sample of the number of time samples, the squared measured neutral current to determine an integrated measured neutral current squared.

11. The system of claim 10, wherein the one or more processors are further configured to:
    square, for each time sample of the number of time samples, the imputed neutral current; and
    integrate, for each time sample of the number of time samples, the squared imputed neutral current to determine an integrated imputed neutral current squared.

12. The system of claim 11, wherein the one or more processors are further configured to determine a phase angle between the integrated measured neutral current squared and the integrated imputed neutral current squared via the Law of Cosines.

13. The system of claim 8, wherein the one or more processors are configured to process one of raw data and filtered data to measure the neutral current.

14. The system of claim 8, wherein the one or more processors are configured to one of sum raw phase current data and sum filtered phase current data to determine the imputed neutral current.

15. The system of claim 8, further comprising a monitoring unit including and meter and at least one processor of the one or more processors.

16. A non-transitory computer-readable medium having computer instructions stored thereon that are executable by a processing device to perform or control performance of operations comprising:
    measuring, for each time sample of a number of time samples, a neutral current of an electrical energy metering system;
    summing, for each time sample of the number of time samples, a number of measured phase current values of the electrical energy metering system to determine an imputed neutral current;
    determining, for each time sample of the number of time samples, a squared difference between the measured neutral current and the imputed neutral current;
    integrating, for each time sample of the number of time samples, the squared difference to determine an accumulator value; and
    detecting, based on the accumulator value, theft of electrical energy from the electrical energy metering system.

17. The non-transitory computer-readable medium of claim 16, wherein the integrating comprises integrating, for each time sample of the number of time samples, the squared difference over an integral number of half cycles to determine the accumulator value.

18. The non-transitory computer-readable medium of claim 16, the operations further comprising:
    squaring, for each time sample of the number of time samples, the measured neutral current; and integrating, for each time sample of the number of time samples, the squared measured neutral current to determine an integrated measured neutral current squared.

19. The non-transitory computer-readable medium of claim 18, the operations further comprising:

squaring, for each time sample of the number of time samples, the imputed neutral current; and integrating, for each time sample of the number of time samples, the squared imputed neutral current to determine an integrated imputed neutral current squared.

20. The non-transitory computer-readable medium of claim 19, the operations further comprising determining a phase angle between the integrated measured neutral current squared and the integrated imputed neutral current squared via the Law of Cosines.

21. The non-transitory computer-readable medium of claim 16, wherein the measuring the neutral current of the electrical energy metering system comprises one of processing raw data and processing filtered data to measure the neutral current.

22. The non-transitory computer-readable medium of claim 16, wherein the summing the number of measured phase currents to determine the imputed neutral current comprises one of summing raw data and summing filtered data.

* * * * *